United States Patent
Hirata et al.

(10) Patent No.: US 7,853,226 B2
(45) Date of Patent: Dec. 14, 2010

(54) PEAK-HOLD CIRCUIT AND SIGNAL STRENGTH INDICATOR USING THE PEAK-HOLD CIRCUIT

(75) Inventors: Manabu Hirata, Tokyo (JP); Takashi Taya, Tokyo (JP); Kazuyuki Tajima, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 570 days.

(21) Appl. No.: 11/979,679

(22) Filed: Nov. 7, 2007

(65) Prior Publication Data

US 2008/0164913 A1 Jul. 10, 2008

(30) Foreign Application Priority Data

Jan. 9, 2007 (JP) .............................. 2007-001185

(51) Int. Cl.
*H04B 1/16* (2006.01)

(52) U.S. Cl. ..................................... 455/226.2; 327/50

(58) Field of Classification Search ................. 455/130, 455/226.1, 226.2, 226.4, 232.1, 250.1, 254; 327/50, 52, 58, 351, 352

See application file for complete search history.

(56) References Cited

U.S. PATENT DOCUMENTS

| | | | | |
|---|---|---|---|---|
| 4,216,502 A | * | 8/1980 | Fox | ............................. 327/50 |
| 5,521,542 A | * | 5/1996 | Kimura | ...................... 327/352 |
| 6,311,049 B1 | * | 10/2001 | Yoshizawa | ............... 455/226.2 |

FOREIGN PATENT DOCUMENTS

JP 2003-163556 A 6/2003

* cited by examiner

*Primary Examiner*—Thanh C Le
(74) *Attorney, Agent, or Firm*—Rabin & Berdo, P.C.

(57) ABSTRACT

A peak-hold circuit includes a differential amplifier having first and second transistors as a differential pair, the first transistor receiving an input signal at its gate, a third transistor connected between a first power supply and an output node connecting a gate of the second transistor, connectivity of the third transistor being controlled by the output of the differential amplifier, a capacitor for holding a peak voltage, connected between the output node and a second power supply, a resistor for discharging, which is connected in parallel to the capacitor, and a fourth transistor connected to the first transistor in parallel, the fourth transistor receiving at its gate an a reference voltage for limiting a voltage.

17 Claims, 7 Drawing Sheets

PEAK-HOLD CIRCUIT AND SIGNAL STRENGTH INDICATOR USING THE PEAK-HOLD CIRCUIT

CROSS-REFERENCE TO RELATED APPLICATION

This application claims the priority benefit of Japanese Patent Application No. 2007-001185, filed Jan. 9, 2008, the entire disclosure of which is incorporated herein by reference.

BACKGROUND OF THE INVENTION

1. Field of the Invention

The invention relates to a peak-hold circuit for holding a peak value of an input signal and a signal strength indicator using the peak-hold circuit, and specifically, relates to a peak-hold circuit, whose operation is an independent from temperatures, power supplies and processes, having a relatively less complicated circuit configuration, and a signal strength indicator using such a peak-hold circuit.

2. Description of the Related Art

In recent years, a walkie-talkie is widely used by the advance of mobile communication technology. A RSSI (Received-Signal Strength Indicator) is used in these devices. Although the general purpose of the RSSI is to measure and display the strength (electric power) of an input signal, the result based on the signal strength is not only fed back to an amplifier circuit of a receiver to be used for automatic gain control, but also requires the transmitter to send another signal based on the strength of the current input signal. Moreover, when the device having a RSSI is used as transmitter, RSSI may estimate its own signal strength and may amplify it to be a signal having a desired strength. Thus, RSSI serves as important functional block used inside the transmitter-receiver of wireless system. This conventional RSSI is disclosed in the reference JP2003-163556

FIG. 2 shows such a conventional RSSI 100. The RSSI 100 outputs a received-signal strength RSS based on the output of each saturated amplifier 101~104, which is connected in four stages. Each saturated amplifier 101~104 has two gain control terminals VC1 and VC2. At the gain control terminal VC1, a bias signal generated in a constant $g_m$ bias generator 151 is applied in order to amplify in a constant rate by the saturated amplifier 101~104 in each stage, regardless of temperature. On the other hand, at the gain control terminal VC2 of the saturated amplifier 101, the output from the saturated amplifier 101 is applied through a rectifier 111, a low pass filter 121, and a bias generator 131 for controlling amplitude. Other gain control terminal VC2 of other saturated amplifiers 102~104 receives a signal similarly through similar components, as well as the terminal VC2 of the amplifier 101. Each bias generator 131~134 generates a bias signal for controlling the amplitude of the signal from the each saturated amplifier 101~104. In other words, the signal from the each saturated amplifier 101~104 is controlled by the bias signal from the bias generator 131~134 not to exceed the determined value of the amplitude. The signals outputted from the low pass filters 121~124 are added by an adder circuit 141, and the result of adding is outputted as the comprehensive received-signal strength RSS.

The conventional RSSI 100 as shown in FIG. 2 includes the saturated amplifiers 101~104 as a gain commensuration means and the bias generator 131~134 as an adjuster means for limiting the saturation amplitude in order to amend the received-signal strength RSS, which is affected by the temperatures, power supplies and processes, on one-chip formation, without using some external components. However, as shown in FIG. 2 or the reference JP2003-163556, each of which discloses an example of a specific circuit, the conventional RSSI 100 requires a lot of circuit components.

SUMMARY OF THE INVENTION

An objective of the invention is to solve the above-described problem and to provide a peak-hold circuit for holding a peak value of an input signal and a signal strength indicator using the peak-hold circuit, and specifically, provides a peak-hold circuit, whose operation is an independent from temperatures, power supplies and processes, having a relatively less complicated circuit configuration, and a signal strength indicator using such a peak-hold circuit.

The objective is achieved by a peak-hold circuit including a differential amplifier having first and second transistors as a differential pair, the first transistor receiving an input signal at its gate, a third transistor connected between a first power supply and an output node connecting a gate of the second transistor, connectivity of the third transistor being controlled by the output of the differential amplifier, a capacitor for holding a peak voltage, connected between the output node and a second power supply, a resistor for discharging, which is connected in parallel to the capacitor, and a fourth transistor connected to the first transistor in parallel, the fourth transistor receiving at its gate a reference voltage for limiting a voltage.

The further objective is achieved by a received-signal strength indicator, including a first amplifier circuit having an input terminal outputting a first signal by amplifying an input signal supplied to the input terminal, a second amplifier circuit outputting a second signal by amplifying the first signal, a first peak-hold circuit outputting a third signal having a first reference voltage when the voltage of the first signal is equal to or lower than the first reference voltage, and holding a peak value of the first signal and outputting a third signal having the peak value of the first signal when the voltage of the first signal is higher than the first reference voltage, a second peak-hold circuit outputting a fourth signal having a second reference voltage when the voltage of the second signal is higher than the second reference voltage, which is higher than the first reference voltage, and holding a peak value of the second signal and outputting a fourth signal having the peak value of the second signal when the voltage of the second signal is equal to or lower than the second reference voltage, an adder circuit adding the voltages of the third and the fourth signals, and outputting an output signal corresponding to a strength of the input signal.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention is explained together with drawings as follows. In each drawing, the same reference numbers designate the same or similar components.

The First Embodiment

Figure 1:
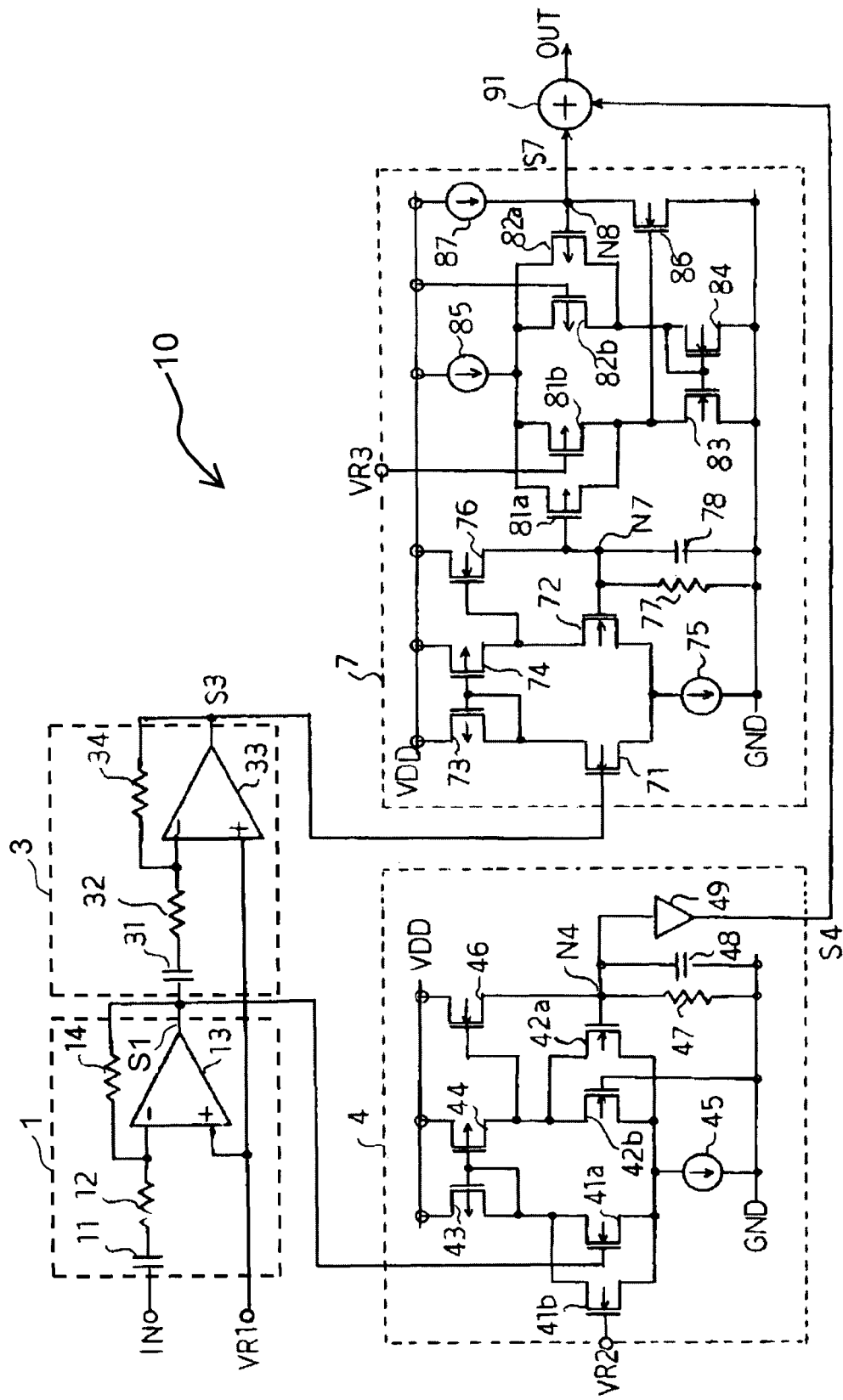
FIG. 1 is a circuit diagram of a RSSI, according to the first embodiment.
Figure 2:
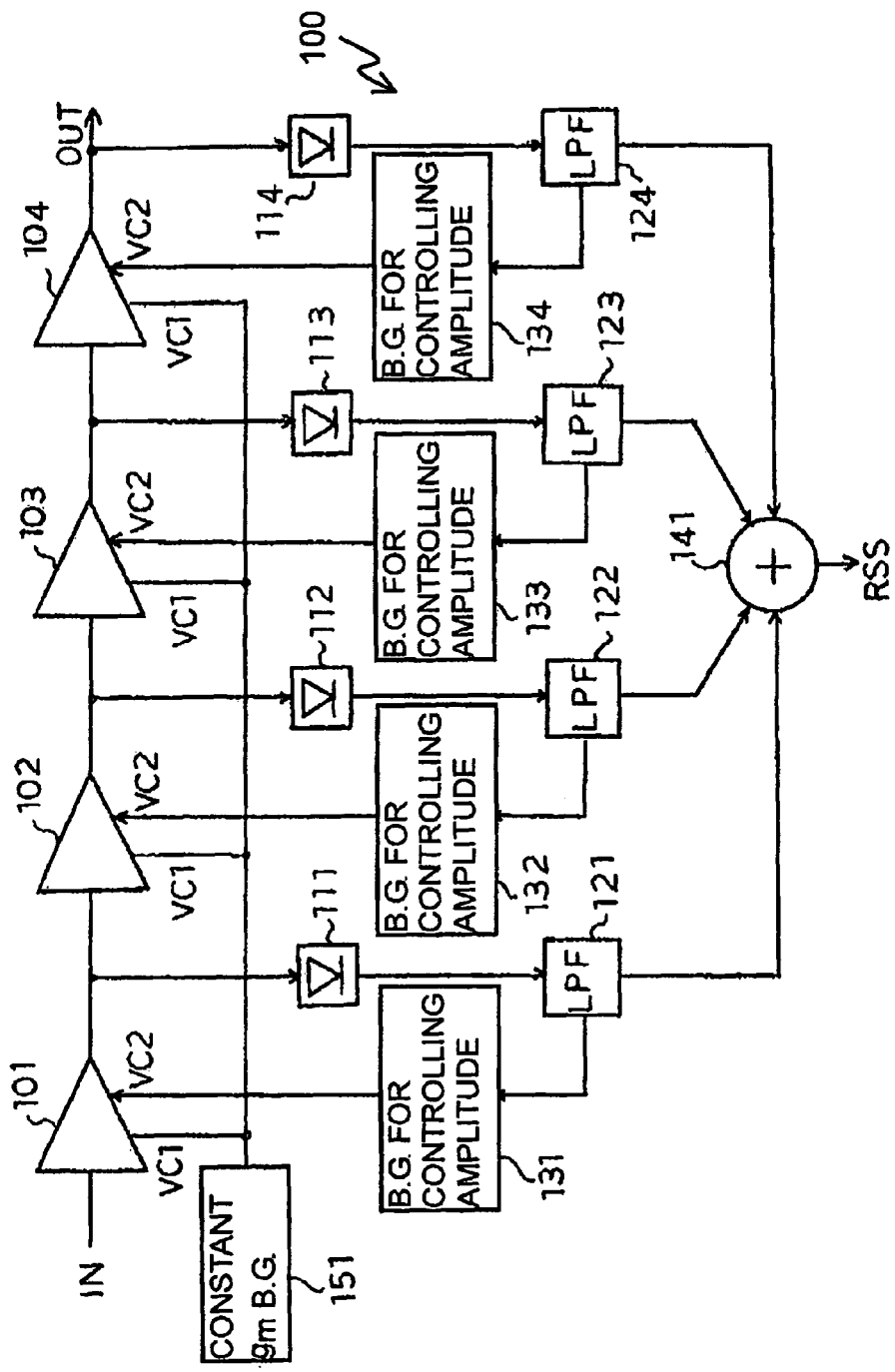
FIG. 2 is a circuit diagram of a conventional RSSI.

FIG. 1 is a circuit diagram of a received-signal strength indicator 10 (hereinafter called a RSSI) of a first embodiment of the invention. The RSSI 10 includes two amplifier circuits 1 and 3, which have a cascade connection in two stages, a first peak-hold circuit 4 for holding a peak value of the amplifier circuit 1, a second peak-hold circuit 7 for holding a peak value of the amplifier circuit 3 and an adding circuit 91 for adding output signals from the first and second peak-hold circuits 4 and 7.

The first amplifier circuit 1 includes a capacitor 11, a resistor 12, an operational amplifier 13 and a feedback resistor 14. The first amplifier circuit 1 further includes an input terminal for an input signal IN, which is connected to a negative input terminal of the operational amplifier 13 through the capacitor 11 and the resistor 12, which are series-connected. A first reference voltage VR1 is applied to the positive input terminal of the operational amplifier 13, and the operational amplifier 13 outputs a signal S1. The signal S1 is fed back to the negative input terminal of the operational amplifier 13 through the feedback resistor 14. The second amplifier circuit 3 amplifies the signal S1 from the first amplifier circuit 1, and outputs a signal S3. The second amplifier circuit 3 includes a capacitor 31, a resistor 32, an operational amplifier 33 and a feedback resistor 34, as well as the first amplifier circuit 1. The connections of the each element in the second amplifier circuit 3 are the same as that in the first amplifier circuit 1. The difference is that the signal S1 is inputted to the capacitor 31 in the second amplifier circuit 3 while the signal IN is inputted to the capacitor 11 in the first amplifier circuit 1.

The first peak-hold circuit 4 includes a first NMOS transistor 41a, a second NMOS transistor 42a, a third NMOS transistor 41b, a fourth NMOS transistor 42b, a fifth NMOS transistor 46, first and second PMOS transistors 43 and 44, a constant current circuit 45, a resistor 47, a capacitor 48 for holding a peak voltage and a voltage follower circuit 49. The first and the second NMOS transistors as a differential pair are operated as a differential amplifier. The first NMOS transistor 41a receives a signal S1 at its gate electrode, and the gate of the second NMOS transistor 42a is connected to a node N4. The drains of the first and the second NMOS transistor 41a and 42a are connected to the power supply voltage VDD through the first and the second PMOS transistors 43 and 44, respectively. The sources of the first and the second NMOS transistors 41a and 42a are commonly connected to the ground GND through the constant current circuit 45. The gates of the first and the second PMOS transistors 43 and 44 are commonly connected to the drain of the first NMOS transistor 41a.

The sources of the first and the third NOMS transistors 41a and 41b are commonly connected, and the drains of them are also commonly connected. The third NMOS transistor 41b receives at its gate a second reference voltage VR2, which is higher than the first reference voltage VR1. The sources of the second and the fourth NMOS transistors 42a and 42b are commonly connected, and the drains of them are also commonly connected. The gate of the fourth NMOS transistor 42b is connected to the ground GND.

The fifth NMOS transistor 46 is connected between the power supply VDD and the node N4, and its gate is connected to the drain of the second NMOS transistor 42a. Between the node N4 and the ground GND, the resistor 47 and the capacitor 48 for holding a peak voltage are connected in parallel. The signal at the node N4 is outputted through the voltage follower circuit 49 as a signal S4.

The second peak-hold circuit 7 includes sixth through eleventh NMOS transistors 71, 72, 76, 83, 84 and 86, third through eighth PMOS transistors 73, 74, 81a, 81b, 82a and 82b, three constant current circuits 75, 85 and 87, a capacitor 78 for holding a peak voltage and a resistor 77. The sixth NMOS 71 and the seventh NMOS 72 as a differential pair, creates a differential amplifier, and the signal S3 is applied to the gate of the sixth NMOS transistor 71. The gate of the seventh NMOS 72 is connected to a node N7. The drains of the sixth and the seventh NMOS transistor 71 and 72 are connected to the power supply voltage VDD through the third and the fourth PMOS transistors 73 and 74, respectively. The sources of the sixth and the seventh NMOS transistor 71 and 72 are commonly connected to the ground GND through the constant current circuit 75. The gates of the third and the fourth PMOS transistors 73 and 74 are commonly connected to the drain of the sixth NMOS transistor 71.

The eighth NMOS transistor 76 is connected between the power supply VDD and the node N7, and its gate is connected to the drain of the seventh NMOS transistor 72. Between the node N7 and the ground GND, the resistor 77 and the capacitor 78 for holding a peak voltage are connected in parallel. The signal at the node N7 is applied to the gate of the fifth PMOS transistor 81a, which creates, together with the sixth PMOS transistor 82a, another differential amplifier. The gate of the sixth PMOS transistor 82a is connected to a node N8.

The drains of the fifth and the sixth PMOS transistors 81a and 82a are connected to the ground GND through the ninth and tenth NMOS transistor 83 and 84, respectively. The sources of the fifth and the sixth PMOS transistors 81a and 82a are commonly connected to the power supply VDD through the constant current circuit 85. The gates of the ninth and the tenth NMOS transistors 83 and 84 are commonly connected to the drain of the sixth PMOS transistor 82a.

The sources of the fifth and the seventh PMOS transistors 81a and 81b are commonly connected, and the drains of them are also commonly connected. The seventh NMOS transistor 81b receives at its gate a third reference voltage VR3, which is higher than the second reference voltage VR2. The sources of the sixth and the eighth PMOS transistors 82a and 82b are commonly connected, and the drains of them are also commonly connected. The gate of the eight NMOS transistor 82b is connected to the power supply VDD.

The eleventh NMOS transistor 86 is connected between the ground GND and the node N8, and its gate is connected to the drain of the fifth PMOS transistor 81a. Between the node N8 and the power supply VDD, the constant current circuit 87 is connected, and a signal S7 is outputted from the node N8. The signals S4 from the first peak-hold circuit 4 and the signal S7 from the second peak-hold circuit 7 are added by the adder circuit 91, and a signal, which indicates the received-signal strength RSS, is outputted from the adder circuit 91, as an output signal OUT of the RSSI 10.

The operation of the RSSI 10 is explained below. First, an operation of the first peak-hold circuit 4 is explained, and then, the operation of the second peak-hold circuit 7 is explained. Finally, the operation of the entire RSSI 10 is explained below.

[Operation of the First Peak-Hold Circuit 4]

Figure 3:
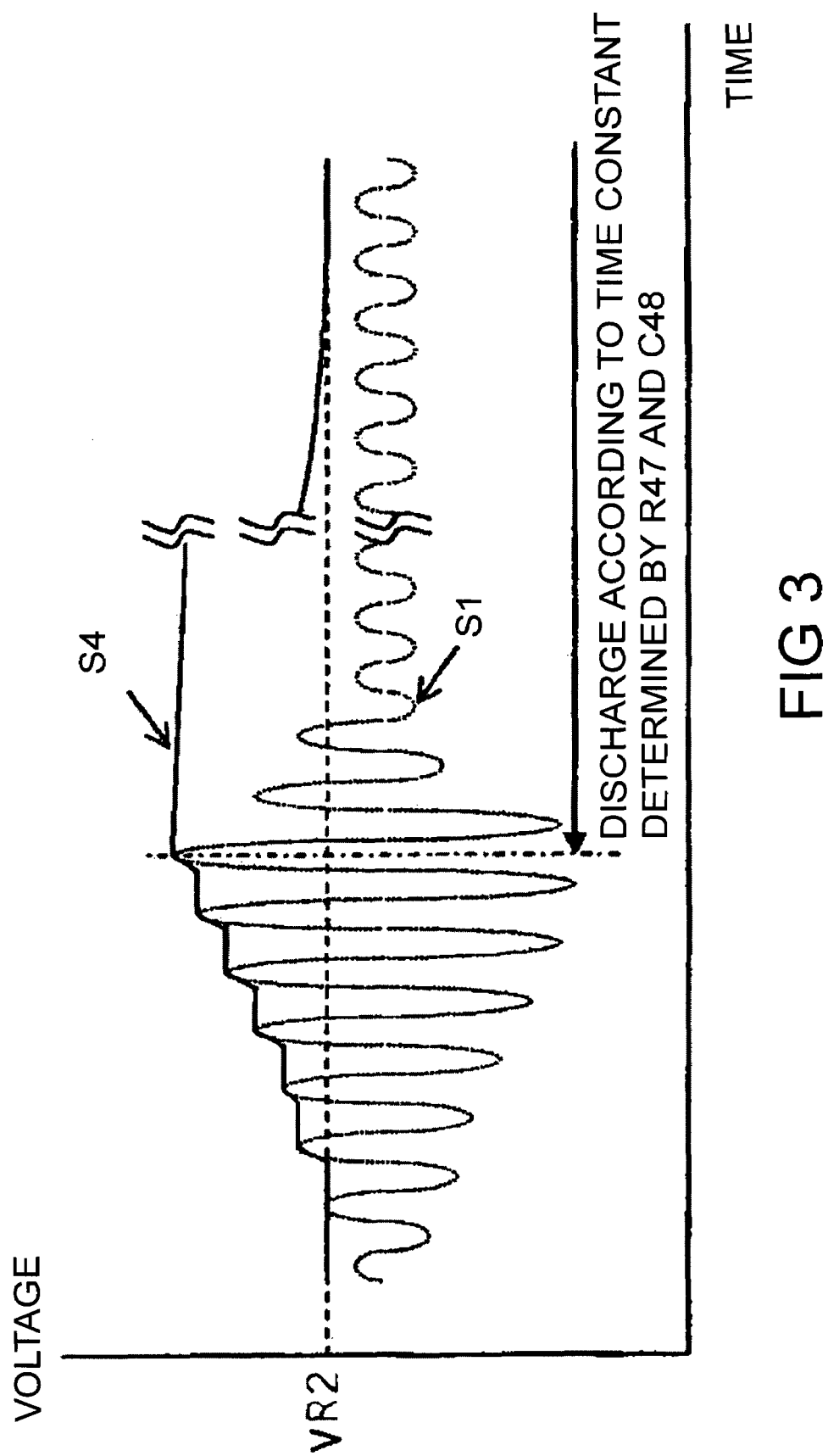
FIG. 3 is a signal waveform showing an operation of a first peak-hold circuit shown in FIG. 1.

The operation of the first peak-hold circuit 4 is explained with reference to FIG. 3 together with FIG. 1. FIG. 3 is a signal waveform showing an operation of the first peak-hold circuit 4 shown in FIG. 1.

In case that the voltage of the signal S1 inputted from the amplifier circuit 1 is higher than the second reference voltage VR2, the voltage between gate/source of the first NMOS transistor 41a is higher than that between gate/source of the third NMOS transistor 41b. Thus, where the transconductance ($g_m$) of the first and the third NMOS transistors 41a and 41b is large enough, the channel current of the first PMOS transistor 43 flows into the first NMOS transistor 41a. On the other hand, the fourth NMOS transistor 42b is formed in order to make a balance of the differential circuit so that it turns off normally. Thus, the channel current of the second PMOS transistor 44 flows into the second NMOS transistor 42a. Accordingly, where the voltage of the signal S1 inputted is higher than the second reference voltage VR2, the first and the second NMOS transistors 41a and 42a as a differential pair are operated as a differential circuit.

When the voltage of the signal S1 increases, the drain voltage of the second NMOS transistor 42a also increases so that the gate voltage of the fifth NMOS transistor 46, which is connected to the drain of the second NMOS transistor 42a, increases. Since the fifth NMOS transistor 46 together with the resistor 47 is operated as a source follower circuit, the drain voltage of the fifth NMOS transistor 46 (that is a voltage at the node N4) increases because of following the increase of its gate voltage. By increasing the gate voltage of the second NMOS transistor 42a, whose gate is connected to the node N4, the voltage at the node N4 becomes equal to the voltage of the signal S1. As a result, the signal S4, which has the same voltage as the signal S1, is outputted from the voltage follower circuit 49.

On the other hand, when the voltage of the signal S1 drops, the drain voltage of the second NMOS transistor 42a also drops so that the gate voltage of the fifth NMOS transistor 46, which is connected to the drain of the second NMOS transistor 42a, drops. Although the fifth NMOS transistor 46 together with the resistor 47 is operated as the source follower circuit as described above, since the capacitor 48 is connected to the drain of the fifth NMOS transistor 46, the electric potential in the capacitor 48 is maintained at its value, which is equals to the voltage of the signal S1 before dropping. Under this condition, since the gate voltage of the first NMOS transistor 41a is lower than that of the second NMOS transistor 42a, the drain voltage of the second NMOS transistor 42a drops further. Thus, the gate voltage of the fifth NMOS transistor 46 whose gate is connected to the drain of the second NMOS transistor 42a also drops further. As a result, the fifth NMOS transistor 46 is in the cut-off state so that the capacitor 48 discharges in accordance with the time constant determined by the capacity C48 of the capacitor 48 and the resistance value R47 of the resistor 47. The capacitor 48 continues to discharge while the voltage of the signal S1 is lower than that at the node N4. The signal having a voltage at the node N4 is outputted from the voltage follower circuit 49 as the signal S4. In other words, according to the peak-hold circuit 4, where the voltage of the signal S1 is higher than the second reference voltage VR2, it is operated as a peak-hold circuit whose input is the gate of the first NMOS transistor 41a.

To the contrary, in case that the voltage of the signal S1 is lower than the second reference voltage VR2, the voltage between gate/source of the first NMOS transistor 41a is lower than that between gate/source of the third NMOS transistor 41b. Thus, the channel current of the first PMOS transistor 43 flows into the third NMOS transistor 41b. Under this condition, since no current flows in the first NMOS transistor 41a, the second and the third NMOS transistors 42a and 41b as a differential pair are operated as a differential circuit. In other word, according to the peak-hold circuit 4, where the voltage of the signal S1 is lower than the second reference voltage VR2, it is operated as a peak-hold circuit whose input is the gate of the third NMOS transistor 41b. Since the second reference voltage VR2 is continuously applied to the gate of the third NMOS transistor 41b, the electric potential applied to the gate of the second NMOS transistor 42a does not depend on the voltage of the signal S1, and is constant. As a result, the signal having a voltage at the gate of the second NMOS transistor 42a is outputted from the voltage follower circuit 49 as the signal S4.

According to the peak-hold circuit 4, where the voltage of the signal S1 as its input signal is equal to or less than the second reference voltage VR2, the peak-hold circuit 4 outputs the signal having the second reference voltage VR2. Where the voltage of the signal S1 becomes higher than the second reference voltage VR2, the peak-hold circuit 4 holds its peak value and outputs the signal having the peak value. Thus, the peak-hold circuit 4 could be defined as a peak-hold circuit having a lower limit, which is the second reference voltage VR2.

[Operation of the Second Peak-Hold Circuit 7]

Figure 4:
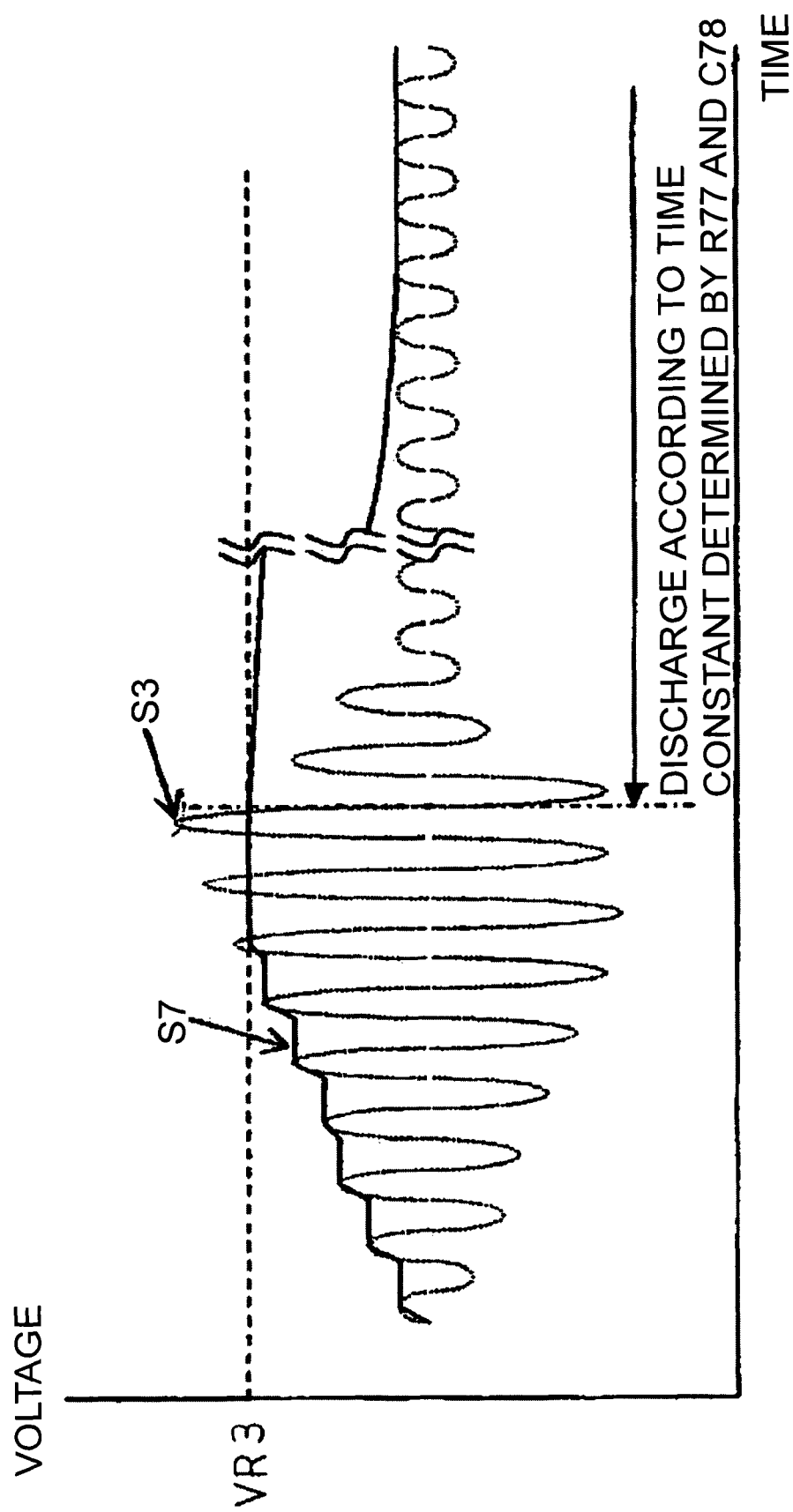
FIG. 4 is a signal waveform showing an operation of a second peak-hold circuit shown in FIG. 1.

The operation of the second peak-hold circuit 7 is explained with reference to FIG. 4 together with FIG. 1. FIG. 4 is a signal waveform showing an operation of the second peak-hold circuit 7 shown in FIG. 1.

A differential circuit part including the sixth and the seventh NMOS transistors 71 and 72 as a differential pair and a peak-hold part including the eighth NMOS transistor 76, the resistor 77 and the capacitor 78 of the second peak-hold circuit 7, is similarly operated as these of the first peak-hold circuit 4, which is under the condition that the voltage of the signal S1 inputted is higher than the second reference voltage VR2. Further, another differential amplifier, which includes the fifth through the eighth PMOS transistors 81a, 81b, 82a and 82b as a differential pair, is a flip-vertical configuration of the differential amplifier of the first peak-hold circuit 4 with replacement from the NMOS transistors to the PMOS transistors, respectively. This differential amplifier creates a voltage follower circuit together with a source-grounded amplifier circuit consisting of the eleventh NMOS transistor 86 and the constant current circuit 87.

When the gate voltage of the fifth PMOS transistor 81a, which is an electric potential at the node N7, is lower than the third reference voltage VR3, the gate/source voltage of the fifth PMOS transistor 81a becomes higher than that of the seventh PMOS transistor 81b. Thus, where the transconductance ($g_m$) of the fifth and the seventh PMOS transistors 81a and 81b is large enough, the channel current of the ninth NMOS transistor 83 is provided from the fifth PMOS transistor 81a only. On the other hand, the eighth PMOS transistor 82b is formed in order to make a balance of the differential circuit so that it turns off normally. Thus, the channel current of the tenth NMOS transistor 84 is provided from the sixth PMOS transistor 82a only. Accordingly, where the electric potential at the node N7 is lower than the third reference voltage VR3, the fifth and the sixth PMOS transistors 81a and 82a as a differential pair are operated as a differential circuit. Since the differential circuit is connected to the source-grounded amplifier circuit, which has the eleventh NMOS transistor 86 and the constant current circuit 87, the signal S7 having the same voltage as the voltage at the node N7 is outputted to the node N8.

On the other hand, when the gate voltage of the fifth PMOS transistor 81a is higher than the third reference voltage VR3, the gate/source voltage of the fifth PMOS transistor 81a becomes lower than that of the seventh PMOS transistor 81b so that the channel current of the ninth NMOS transistor 83 is provided from the seventh PMOS transistor 81b only. Under this condition, since no electric current flows in the fifth PMOS transistor 81a, the sixth and the seventh PMOS transistors 82a and 81b as a differential pair are operated as a differential circuit. Thus, an input terminal of the voltage follower circuit having the differential circuit of this condition is the gate of the seventh PMOS transistor 81b. Since the third reference voltage VR3 is continuously applied to the gate of the seventh PMOS transistor 81b, the signal S7 having a constant voltage, which is equal to the third reference voltage VR3, is outputted from the node N8, which is the output terminal of the voltage follower circuit. Namely, the voltage of the signal S7 does not depend on the voltage at the node N7 under this condition.

Therefore, when the voltage of the signal S3 inputted to the second peak-hold circuit 7 increases, the voltage at the node N7 becomes the same as that of the signal S3 by following the signal S3. Under this condition, when the voltage at the node N7 is lower than the third reference voltage VR3, the gate voltage of the fifth PMOS transistor 81a becomes lower than the third reference voltage VR3 so that the voltage of the signal S7 at the node N8 becomes equal to the voltage of the signal S3 by following the signal S3. On the other hand, when the voltage at the node N7 is higher than the third reference voltage VR3, the gate voltage of the fifth PMOS transistor 81a becomes higher than the third reference voltage VR3 so that the voltage of the signal S7 at the N8 becomes a constant voltage, which is limited by the third reference voltage VR3.

On the other hand, when the voltage of the signal S3 inputted to the second peak-hold circuit 7 drops, the electric potential at the node N7 is maintained at its value that is the electric potential of the capacitor 78 at the condition before the voltage of the signal S3 drops. Under this condition, when the voltage at the node N7 is lower than the third reference voltage VR3, since the electric potential, which is lower than the third reference voltage VR3, is applied to the gate voltage of the fifth PMOS transistor 81a, the signal S7 having a voltage, which is equal to the voltage of the signal S3 before dropping, is outputted from the node N8. When the voltage at the node N7 is higher than the third reference voltage VR3, since the electric potential, which is higher than the third reference voltage VR3, is applied to the gate voltage of the fifth PMOS transistor 81a, the voltage of the signal S7 at the N8 becomes a constant voltage, which is limited by the third reference voltage VR3.

Accordingly, the peak-hold circuit 7 outputs the signal S7 having the third reference voltage VR3 when the electric potential of the signal S3 is higher than the third reference voltage VR3, and holds its peak value and outputs the signal S7 with the peak value when the electric potential of the signal S3 is equal to or less than the third reference voltage VR3. In other words, the peak-hold circuit 4 could be defined as a peak-hold circuit having a upper limit, which is the third reference voltage VR3.

[Operation of the RSSI 10 as a Whole]

Figure 5:
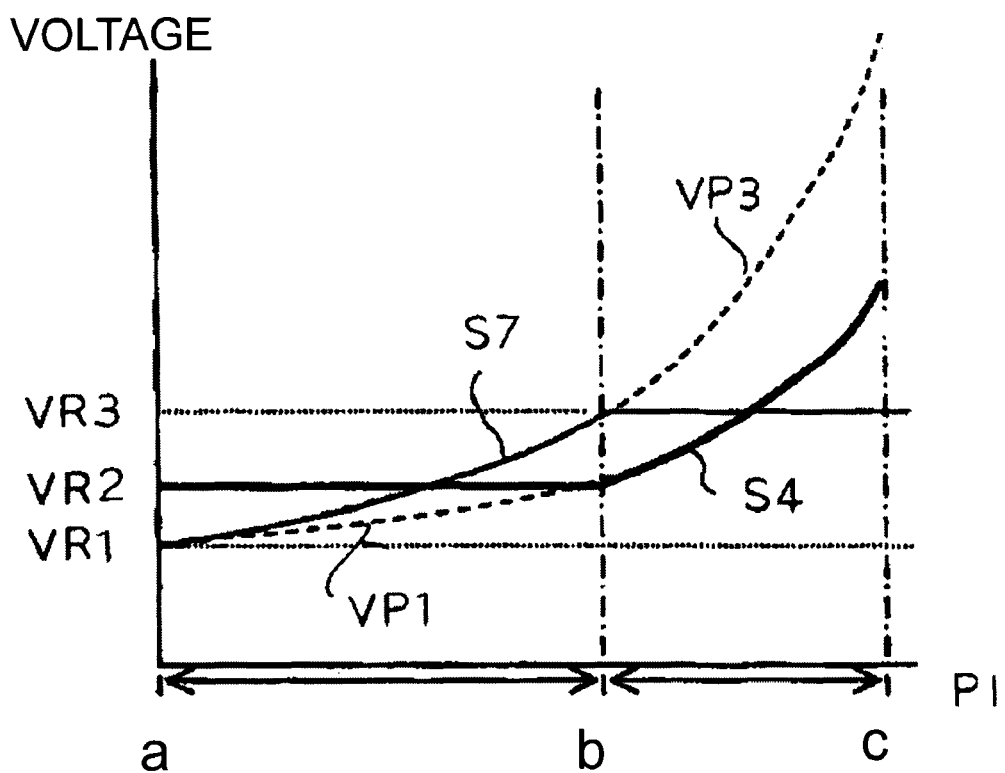
FIG. 5 is a graph showing I/O characteristics of the first and the second peak-hold circuits of the first embodiment of the invention.
Figure 6:
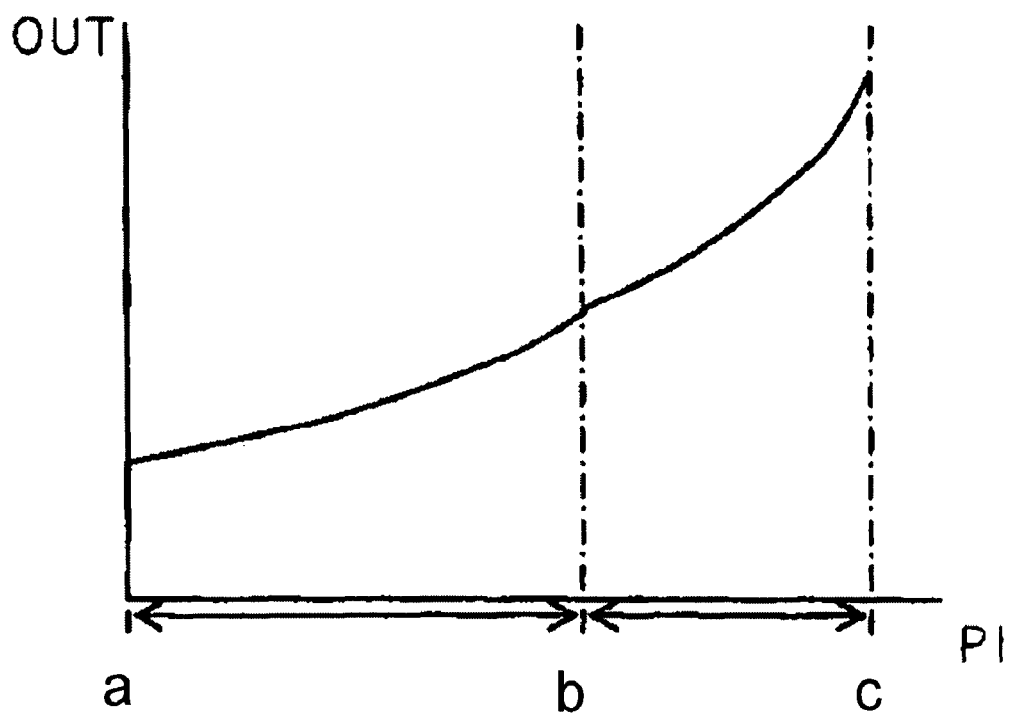
FIG. 6 is a graph showing I/O characteristics of the RSSI of the first embodiment of the invention.

The operation of the RSSI 10 as a whole is explained with reference to FIGS. 5 and 6 together with FIG. 1. FIG. 5 is a graph showing I/O characteristics of the first and the second peak-hold circuits 4 and 7, and FIG. 6 is a graph showing I/O characteristics of the RSSI 10 of FIG. 1 as a whole. In each drawing, an input power (P) in dB is measured along the horizontal axis, and an output voltage is measured along the vertical axis.

The input signal IN of the RSSI 10 is amplified by the amplifier circuits 1 and 3, which have a cascade connection in two stages. A gain A1 of the amplifier circuit 1 and a gain A3 of the amplifier circuit 3 can be calculated in the following equations (1) where each resistance value of the resistors 12, 14, 32 and 34 is defined as R12, R14, R32 and R34, respectively.

$$\left. \begin{array}{l} A1 = R14/R12 \\ A3 = R34/R32 \end{array} \right\} \quad (1)$$

Further, when amplitude of an alternating current of the input signal IN is defined as VIp-p, amplitudes VO1p-p and VO3p-p of the signals S1 and S3, which are output signal from the amplifier circuits 1 and 3, are calculated in the following equations (2)

$$\left. \begin{array}{l} VO1p-p = A1 \times VIp-p \\ VO3p-p = A1 \times A3 \times VIp-p \end{array} \right\} \quad (2)$$

Since the input sides of amplifier circuits 1 and 3 are A/C-coupled by each capacitor 11, 31, the power point of the output of each amplifier circuit 1, 3 is the first reference voltage VR1, which is applied to each positive input terminal (+) of the operational amplifiers 13, 33. Thus, the signals S1 and S3, each of which has the amplitude VO1p-p and VO3p-p whose center is the reference voltage VR1, are alternating current signals, respectively. As a result, the peak voltages VP1 and VP3 of the signals S1, S3 are calculated in the following equations (3).

$$\left. \begin{array}{l} VP1 = VR1 + VO1p-p/2 \\ VP3 = VR1 + VO3p-p/2 \end{array} \right\} \quad (3)$$

When the input signal IN has power (PI), which is measured by unit (dBμV), the above-described peak voltages VP1 and VP2 are calculated in the following equations (4), and their relationships with the input signal IN are shown in FIG. 5 by dashed exponential curves.

$$\left. \begin{array}{l} VP1 = VR1 + A1 \cdot \sqrt{2} \cdot 10^{\frac{PI}{20}-6} \\ VP3 = VR1 + A1 \cdot A3 \cdot \sqrt{2} \cdot 10^{\frac{PI}{20}-6} \end{array} \right\} \quad (4)$$

Since the signal S1 outputted from the amplifier circuit 1 located in the first stage is inputted to the first peak-hold circuit 4 having the lower limit, the peak value is detected when the voltage of the signal S1 becomes higher than the second reference voltage VR2. Under this condition, the characteristic of the signal S4 outputted from the first peak-hold circuit 4 is illustrated in a solid line between b and c in FIG. 5.

On the other hand, while the voltage of the signal S1 is equal to or less than the second reference voltage VR2, since the second reference voltage VR2 is recognized as an input signal for the peak detection, the characteristic of the signal S4 is illustrated in a solid line between a and b in FIG. 5.

Since the signal S1 outputted from the amplifier circuit 3 located in the second stage is inputted to the second peak-hold circuit 7 having the upper limit, the peak value is detected when the voltage of the signal S3 is equal to or less than the third reference voltage VR3. Under this condition, the characteristic of the signal S7 outputted from the second peak-hold circuit 7 is illustrated in a solid line between a and b in FIG. 5. On the other hand, while the voltage of the signal S3 is higher than the third reference voltage VR3, since the third reference voltage VR3 is recognized as an input signal for the peak detection, the characteristic of the signal S7 is illustrated in a solid line between b and c in FIG. 5.

The signals S4 and S7 outputted from the first and the second peak-hold circuits 4 and 7 are added by the adder circuit 91. As shown in FIG. 5, if the second and third reference voltages VR2 and VR3 are set as that the curving sections of the output characteristics of the first and the second peak-hold circuits 4 and 7 are not overlapped, the output signal OUT from the adder circuit 91 becomes a two-level signal as shown in FIG. 6, and a good linear characteristics can be obtained.

According to the first embodiment, the RSSI 10 includes the first peak-hold circuit 4 for detecting a peak value having the lower limit based on the signal S1 outputted from the amplifier circuit 1 of the first stage, the second peak-hold circuit 7 for detecting a peak value having the upper limit based on the signal S3 outputted from the amplifier circuit 3 of the second stage, and the adder circuit 91, which outputs the signal OUT indicating the signal strength by adding the signals S4 and S7 detected by the first and the second peak-hold circuit 4 and 7. According to this structural configuration of each component, the wide dynamic range signal strength can be detected and be outputted. Further, since each circuit component is formed by the simple negative feedback circuit, highly accurate outputs, which does not depend on the ambient temperature, the power supply and the manufacturing process, can be expected with a small number of the circuit components.

The Second Embodiment

Figure 7:
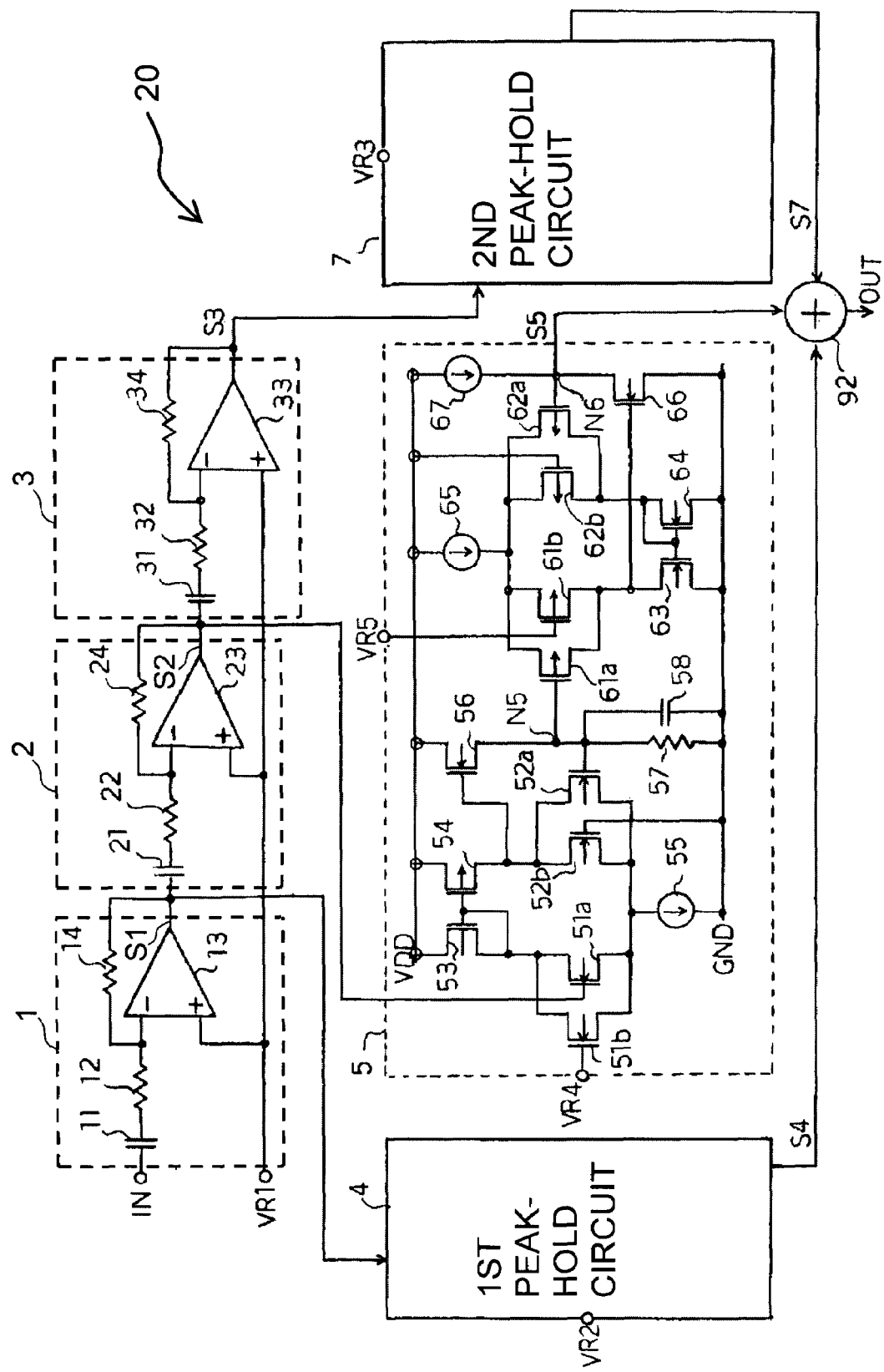
FIG. 7 is a circuit diagram of a RSSI, according to the second embodiment.

FIG. 7 is a circuit diagram of a RSSI 20 of the second embodiment. In FIGS. 1 and 7, the same reference numbers designate the same or similar components.

The RSSI 20 includes an additional amplifier circuit 2 located between the amplifier circuits 1 and 3 shown in FIG. 1. Thus, the RSSI 20 of the second invention includes three amplifier circuits 1, 2 and 3, which are connected in three stages. In addition, the RSSI 20 further includes a third peak-hold circuit 5 for holding peak value of an output signal S2 of the amplifier circuit 2 inserted. Moreover, the adder circuit 91 of the first embodiment is replaced to an adder circuit 92 for adding the signals outputted from the first, second and third peak-hold circuit 4, 7 and 5.

The amplifier circuit 2 has a similar circuit configuration to other amplifier circuit 1 or 3. The amplifier circuit 2 amplifies the signal S1 from the amplifier circuit 1 and outputs the signal S2 to the amplifier circuit 3 and to the third peak-hold circuit 5.

The third peak-hold circuit 5, which combines the first and the second peak-hold circuits 4 and 7, could be defined as a peak-hold circuit having lower and upper limits for detecting peak values having the lower and the upper limits. For the sake of brevity, the detail explanation of the operation of the third peak-hold circuit 5 is omitted because the operations of the first and second peak-hold circuits 4 and 7 are well explained above. As well as the first peak-hold circuit 4, the third peak-hold circuit 5 outputs a signal S5 having a voltage, which is the same as a fourth reference voltage VR4, when the signal S2 is equal to or less than the fourth reference voltage VR4 where the fourth reference voltage VR4 is higher than the second reference voltage VR2 but less than the third reference voltage VR3 (VR3>VR4>VR2). Furthermore, as well as the second peak-hold circuit 7, the third peak-hold circuit 5 outputs a signal S5 having a voltage, which is the same as a fifth reference voltage VR5, when the signal S2 becomes higher than the fifth reference voltage VR5 where the fifth reference voltage VR5 is higher than the fourth reference voltage VR4 but less than the third reference voltage VR3 (VR3>VR5>VR4). Thus, the third peak-hold circuit 5 outputs the signal S5, whose lower limit is the fourth reference voltage VR4, and whose upper limit is the fifth reference voltage VR5.

Figure 8:
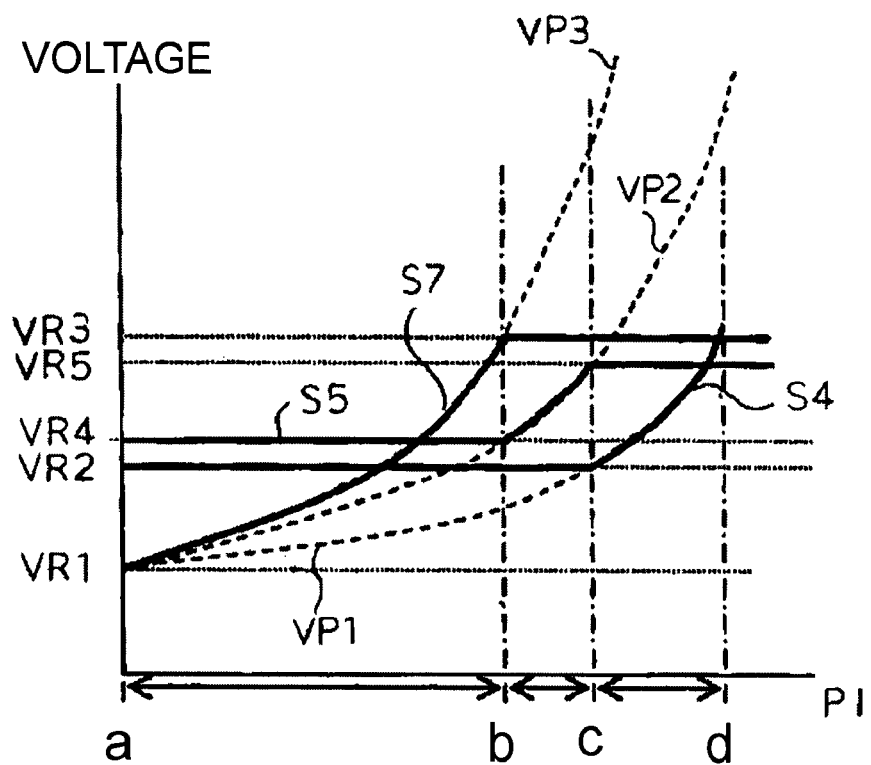
FIG. 8 is a graph showing I/O characteristics of each peak-hold circuit shown in FIG. 7.
Figure 9:
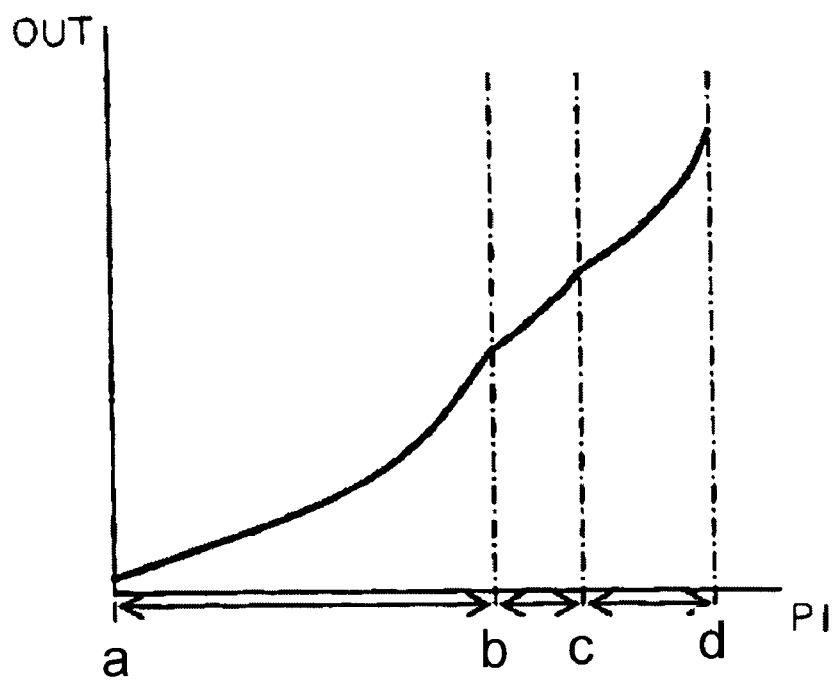
FIG. 9 is a graph showing I/O characteristics of the RSSI shown in FIG. 7.

FIG. 8 is a graph showing I/O characteristics of the first through the third peak-hold circuits shown in FIG. 7, and FIG. 9 is a graph showing I/O characteristics of the RSSI 20 shown in FIG. 7. The operation of the RSSI 20 shown in FIG. 7 is explained below with reference to FIGS. 8 and 9.

The input signal IN is amplified by the amplifier circuits 1, 2 and 3, which are serially connected, and each amplifier circuit 1, 2 or 3 outputs the signal S1, S2 or S3, respectively. The signal S1 is applied to the first peak-hold circuit 4, and the peak voltage VP1 is detected in the first peak-hold circuit 4. As a result, the signal S4 whose lower limit is the second reference voltage VR2, is outputted. As shown in FIG. 8 with the solid line, the voltage of the signal S4 becomes the second reference voltage VR2 during a period between a and c of the input power (PI), and increases along the curve of the peak voltage VP1 during the period between c and d.

The signal S2 is applied to the third peak-hold circuit 5, and the peak voltage VP2 is detected in the third peak-hold circuit 5. As a result, the signal S5 whose lower limit is the fourth reference voltage VR4 and whose upper limit is the fifth reference voltage VR5, is outputted. As shown in FIG. 8 with the solid line, the voltage of the signal S5 becomes the fourth reference voltage VR4 during a period between a and b of the input power (PI), increases along the curve of a peak voltage VP2 during the period between b and c, and becomes the fifth reference voltage VR5 during the period between c and d.

The signal S3 is applied to the second peak-hold circuit 7, and the peak voltage VP3 is detected in the second peak-hold circuit 7. As a result, the signal S7 whose upper limit is the third reference voltage VR3, is outputted. As shown in FIG. 8 with the solid line, the input power (PI) of the signal S7 becomes a peak voltage VP3 between a and b, and becomes the third reference voltage VR3 between b and d. As shown in FIG. 8 with the solid line, the voltage of the signal S7 increases along the curve of a third peak voltage VP3 during a period between a and b of the input power (PI), and becomes the third reference voltage VR3 during the period between b and d.

The signals S4, S5 and S7 are added by the adder circuit 92. As shown in FIG. 8, if the second through fifth reference voltages VR2~VR5 are set as that the curving sections of the output characteristics of the first through the third peak-hold circuits 4, 5, 7 are not overlapped, the output signal OUT from the adder circuit 92 becomes a three-level signal as shown in FIG. 9, and a linear characteristics, which is better than that of the two-level signal shown in FIG. 6, can be obtained.

According to the second embodiment, in addition to the circuit components of the RSSI 10, the RSSI 20 further includes the additional amplifier circuit 2 as the intermediate stage between the amplifier circuit 1 and 3, and the third peak-hold circuit 5 for detecting the peak value having the lower limit an upper limit based on the signal S2 of the amplifier circuit 2. According to this structural configuration of each component, as well as the first embodiment, since each circuit component is formed by the simple circuit structure, highly accurate outputs, which does not depend on the ambient temperature, the power supply and the manufacturing process, can be expected with a small number of the circuit components. Moreover, the signal strength having a linear characteristics, which is better than that of the two-level signal shown in FIG. 6, can be detected, and outputted.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, in the second embodiment, more than one additional amplifier circuit as the intermediate stage can be placed between the amplifier circuits 1 and 3, and peak-hold circuits, each of which corresponds to each additional amplifier circuit and has upper and lower limits, are also formed. Moreover, the circuit consignation of each peak-hold circuit 4, 5 or 7 is not limited as described in the first and second embodiment. Any circuit having similar functions can be replaced. Furthermore, it was explained that the signals of the peak-hold circuits are added and the RSSI outputs the signal showing the signal strength in the first and the second embodiment. However, the peak-hold circuit having an additional transistor for controlling voltage in parallel to the differential pair transistor of the differential amplifier, such as the peak-hold circuit 4 can be used other than the RSSI, as the peak-hold circuit having characteristics, which does not depend on the ambient temperature, the power supply and the change of the manufacturing process.

Various other modifications of the illustrated embodiment will be apparent to those skilled in the art on reference to this description. Therefore, the appended claims are intended to cover any such modifications or embodiments as fall within the true scope of the invention.

What we claim is:

1. A peak-hold circuit, comprising:
   a differential amplifier having first and second transistors as a differential pair, the first transistor receiving an input signal at its gate;
   a third transistor connected between a first power supply and an output node connecting a gate of the second transistor, connectivity of the third transistor being controlled by the output of the differential amplifier;
   a capacitor for holding a peak voltage, connected between the output node and a second power supply;
   a resistor for discharging, which is connected in parallel to the capacitor; and
   a fourth transistor connected to the first transistor in parallel, the fourth transistor receiving at its gate a reference voltage for limiting a voltage.

2. A peak-hold circuit as claimed in claim 1, further comprising a fifth transistor connected to the second transistor in parallel, the fifth transistor receiving at its gate the second power supply.

3. A received-signal strength indicator, comprising:
   a first amplifier circuit having an input terminal outputting a first signal by amplifying an input signal supplied to its input terminal;
   a second amplifier circuit outputting a second signal by amplifying the first signal;
   a first peak-hold circuit outputting a third signal having a first reference voltage when the voltage of the first signal is equal to or lower than the first reference voltage, and holding a peak value of the first signal and outputting a third signal having the peak value of the first signal when the voltage of the first signal is higher than the first reference voltage;
   a second peak-hold circuit outputting a fourth signal having a second reference voltage when the voltage of the second signal is higher than the second reference voltage, which is higher than the first reference voltage, and holding a peak value of the second signal and outputting a fourth signal having the peak value of the second signal when the voltage of the second signal is equal to or lower than the second reference voltage; and
   an adder circuit adding the voltages of the third and the fourth signals, and outputting an output signal corresponding to a strength of the input signal.

4. A received-signal strength indicator as claimed in claim 3, wherein the first amplifier circuit includes,
   a first capacitor connecting the input terminal,
   a first resistor connected to the first capacitor,
   a second resistor, and
   a first operational amplifier having a positive input terminal and a negative input terminal, the first operational amplifier receiving a third reference voltage at its positive input terminal, and its negative input terminal connecting to the first resistor, and the first operational amplifier outputting the first signal, which is also fed back to its negative input terminal through the second resistor, and
   wherein the second amplifier circuit includes,
   a second capacitor connecting the output of the first amplifier circuit,
   a third resistor connected to the second capacitor,
   a fourth resistor, and
   a second operational amplifier having a positive input terminal and a negative input terminal, the second operational amplifier receiving the third reference voltage at its positive input terminal, and its negative input terminal connecting to the third resistor, and the second operational amplifier outputting the second signal, which is also fed back to its negative input terminal through the fourth resistor.

5. A received-signal strength indicator as claimed in claim 3, wherein the first peak-hold circuit includes,
   a differential amplifier having first and second transistors as a differential pair, the first transistor receiving the first signal at its gate;
   a third transistor connected between a first power supply and an output node connecting a gate of the second transistor, connectivity of the third transistor being controlled by the output of the differential amplifier;
   a capacitor for holding a peak voltage, connected between the output node and a second power supply; and
   a resistor for discharging, which is connected in parallel to the capacitor; and a fourth transistor connected to the first transistor in parallel, the fourth transistor receiving at its gate the first reference voltage for limiting a voltage.

6. A received-signal strength indicator as claimed in claim 3, further comprising a fifth transistor connected to the second transistor in parallel, the fifth transistor receiving at its gate the second power supply.

7. A received-signal strength indicator as claimed in claim 3, wherein the second peak-hold circuit includes,
a first differential amplifier having first and second transistors as a differential pair, the first transistor receiving the second signal at its gate;
a third transistor connected between a first power supply and an output node connecting a gate of the second transistor, connectivity of the third transistor being controlled by the output of the differential amplifier;
a second differential amplifier having fourth and fifth transistors as a differential pair, the fourth transistor receiving the first power supply at its gate through the third transistor;
a capacitor for holding a peak voltage, connected between the output node and a second power supply;
a resistor for discharging, which is connected in parallel to the capacitor;
a sixth transistor connected to the fourth transistor in parallel, the sixth transistor receiving at its gate the second reference voltage for limiting a voltage; and
a source-grounded amplifier circuit having a seventh transistor and a constant current circuit, whereby the second differential amplifier and the source-grounded amplifier circuit comprise a voltage follower circuit.

8. A received-signal strength indicator as claimed in claim 7, further comprising a eighth transistor connected to the fifth transistor in parallel, the eighth transistor continuously receiving at its gate the first power supply.

9. A received-signal strength indicator, comprising:
a first-stage amplifier circuit having an input terminal outputting a first signal by amplifying an input signal supplied to its input terminal;
an intermediate-stage amplifier circuit outputting a second signal by amplifying the first signal;
a final-stage amplifier circuit outputting a third signal by amplifying the second signal;
a first peak-hold circuit outputting a fourth signal having a first reference voltage when the voltage of the first signal is equal to or lower than the first reference voltage, and holding a peak value of the first signal and outputting a fourth signal having the peak value of the first signal when the voltage of the first signal is higher than the first reference voltage;
a second peak-hold circuit outputting a fifth signal having a second reference voltage when the voltage of the third signal is higher than the second reference voltage, which is higher than the first reference voltage, and holding a peak value of the third signal and outputting a fifth signal having the peak value of the third signal when the voltage of the third signal is equal to or lower than the second reference voltage;
a third peak-hold circuit outputting a sixth signal having a third reference voltage when the voltage of the second signal is equal to or lower than the third reference voltage, which is higher than the first reference voltage but lower than the second reference voltage, outputting a sixth signal having a fourth reference voltage when the voltage of the second signal is higher than the fourth reference voltage, which is higher than the third reference voltage but lower than the second reference voltage, and holding a peak value of the second signal and outputting a sixth signal having the peak value of the second signal when the voltage of the second signal is equal to or lower than the fourth reference voltage, but higher than the third reference voltage; and
an adder circuit adding the voltages of the fourth, the fifth and the sixth signals, and outputting a output signal corresponding to a strength of the input signal.

10. A received-signal strength indicator as claimed in claim 9, wherein the first-stage amplifier circuit includes,
a first capacitor connecting the input terminal,
a first resistor connected to the first capacitor,
a second resistor, and
a first operational amplifier having a positive input terminal and a negative input terminal, the first operational amplifier receiving a fifth reference voltage at its positive input terminal, and its negative input terminal connecting to the first resistor, and the first operational amplifier outputting the first signal, which is also fed back to its negative input terminal through the second resistor,
wherein the intermediate-stage amplifier circuit includes,
a second capacitor connecting the output of the first amplifier circuit,
a third resistor connected to the second capacitor,
a fourth resistor, and
a second operational amplifier having a positive input terminal and a negative input terminal, the second operational amplifier receiving the fifth reference voltage at its positive input terminal, and its negative input terminal connecting to the third resistor, and the second operational amplifier outputting the second signal, which is also fed back to its negative input terminal through the fourth resistor, and
wherein the final-stage amplifier circuit includes,
a third capacitor connecting the output of the second amplifier circuit,
a fifth resistor connected to the third capacitor,
a sixth resistor, and
a third operational amplifier having a positive input terminal and a negative input terminal, the second operational amplifier receiving the fifth reference voltage at its positive input terminal, and its negative input terminal connecting to the fifth resistor, and the third operational amplifier outputting the third signal, which is also fed back to its negative input terminal through the sixth resistor.

11. A received-signal strength indicator as claimed in claim 9, wherein the first peak-hold circuit includes,
a differential amplifier having first and second transistors as a differential pair, the first transistor receiving the first signal at its gate;
a third transistor connected between a first power supply and an output node connecting a gate of the second transistor, connectivity of the third transistor being controlled by the output of the differential amplifier;
a capacitor for holding a peak voltage, connected between the output node and a second power supply;
a resistor for discharging, which is connected in parallel to the capacitor; and
a fourth transistor connected to the first transistor in parallel, the fourth transistor receiving at its gate the first reference voltage for limiting a voltage.

12. A received-signal strength indicator as claimed in claim 11, further comprising a fifth transistor connected to the second transistor in parallel, the fifth transistor receiving at its gate the second power supply.

13. A received-signal strength indicator as claimed in claim 9, wherein the second peak-hold circuit includes,
- a first differential amplifier having first and second transistors as a differential pair, the first transistor receiving the third signal at its gate;
- a third transistor connected between a first power supply and an output node connecting a gate of the second transistor, connectivity of the third transistor being controlled by the output of the differential amplifier;
- a second differential amplifier having fourth and fifth transistors as a differential pair, the fourth transistor receiving the first power supply at its gate through the third transistor;
- a capacitor for holding a peak voltage, connected between the output node and a second power supply;
- a resistor for discharging, which is connected in parallel to the capacitor;
- a sixth transistor connected to the fourth transistor in parallel, the sixth transistor receiving at its gate the second reference voltage for limiting a voltage; and
- a source-grounded amplifier circuit having a seventh transistor and a constant current circuit, whereby the second differential amplifier and the source-grounded amplifier circuit comprise a voltage follower circuit.

14. A received-signal strength indicator as claimed in claim 13, further comprising a eighth transistor connected to the fifth transistor in parallel, the eighth transistor continuously receiving at its gate the first power supply.

15. A received-signal strength indicator as claimed in claim 9, wherein the third peak-hold circuit includes,
- a first differential amplifier having first and second transistors as a differential pair, the first transistor receiving the second signal at its gate;
- a third transistor connected between a first power supply and an output node connecting a gate of the second transistor, connectivity of the third transistor being controlled by the output of the differential amplifier;
- a fourth transistor connected to the first transistor in parallel, the fourth transistor receiving at its gate the third reference voltage for limiting a voltage;
- a capacitor for holding a peak voltage, connected between the output node and a second power supply;
- a resistor for discharging, which is connected in parallel to the capacitor;
- a second differential amplifier having fifth and sixth transistors as a differential pair, the fifth transistor receiving the first power supply at its gate through the third transistor;
- a seventh transistor connected to the fifth transistor in parallel, the seventh transistor receiving at its gate the fourth reference voltage for limiting a voltage; and
- a source-grounded amplifier circuit having a eighth transistor and a constant current circuit, whereby the second differential amplifier and the source-grounded amplifier circuit comprise a voltage follower circuit.

16. A peak-hold circuit as claimed in claim 15, further comprising an ninth transistor connected to the second transistor in parallel, the ninth transistor receiving at its gate the second power supply, and an tenth transistor connected to the sixth transistor in parallel, the tenth transistor receiving at its gate the first power supply.

17. A received-signal strength indicator as claimed in claim 9, wherein the intermediate-stage amplifier circuit includes a plurality of sub-amplifier circuits, which are connected in serial, and further comprising, a plurality of sub-peak-hold circuits, each of which corresponds to one of the sub-amplifier circuits.

* * * * *